United States Patent
Suzuki

(10) Patent No.: US 6,933,190 B2
(45) Date of Patent: Aug. 23, 2005

(54) SEMICONDUCTOR DEVICE HAVING A CAPACITOR WITH RARE METAL ELECTRODE

(75) Inventor: Toshiya Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/765,437

(22) Filed: Jan. 22, 2001

(65) Prior Publication Data

US 2002/0047201 A1 Apr. 25, 2002

(30) Foreign Application Priority Data

Aug. 25, 2000 (JP) ........................................ 2000-255708

(51) Int. Cl.$^7$ .......................................... H01L 21/8242
(52) U.S. Cl. ...................... 438/239; 438/240; 438/253; 438/622; 438/634
(58) Field of Search .................. 438/622, 637, 438/629, 634, 672, 675, 239, 240, 253

(56) References Cited

U.S. PATENT DOCUMENTS

| | | | | |
|---|---|---|---|---|
| 5,530,279 A | * | 6/1996 | Yamamichi et al. | ........ 257/310 |
| 5,567,243 A | * | 10/1996 | Foster et al. | ........... 118/730 |
| 5,633,781 A | * | 5/1997 | Saenger et al. | ......... 361/321.4 |
| 5,780,908 A | * | 7/1998 | Sekiguchi et al. | ......... 257/383 |
| 6,054,391 A | * | 4/2000 | Nam et al. | .................. 438/706 |
| 6,077,450 A | * | 6/2000 | Lee | .............................. 216/72 |
| 6,169,009 B1 | * | 1/2001 | Ju et al. | ..................... 438/396 |
| 6,284,649 B1 | * | 9/2001 | Miyamoto | .................. 438/643 |
| 6,287,975 B1 | * | 9/2001 | DeOrnellas et al. | ........ 438/710 |
| 6,303,426 B1 | * | 10/2001 | Alers | ......................... 438/240 |
| 6,342,425 B1 | * | 1/2002 | Joo | ............................. 438/396 |
| 6,420,272 B1 | * | 7/2002 | Shen et al. | ................. 438/702 |
| 6,452,274 B1 | * | 9/2002 | Hasegawa et al. | .......... 257/758 |
| 6,692,648 B2 | * | 2/2004 | Hwang et al. | ................ 216/55 |

FOREIGN PATENT DOCUMENTS

| | | |
|---|---|---|
| JP | 09-266289 A | 10/1997 |
| JP | 10-107218 A | 4/1998 |
| JP | 10-173152 A | 6/1998 |
| JP | 2000-183299 A | 6/2000 |

* cited by examiner

*Primary Examiner*—Maria F. Guerrero
(74) *Attorney, Agent, or Firm*—Westerman, Hattori, Daniels & Adrian, LLP

(57) ABSTRACT

A method of manufacturing a semiconductor device, includes the steps of: (a) forming a first inter-level insulating film on a semiconductor substrate formed with semiconductor elements; (b) forming a contact hole through the first inter-level insulating film; (c) forming a plug made of conductive material capable of being nitrided, the plug being embedded in the contact hole; and (d) heating the semiconductor substrate in a nitriding atmosphere to nitride the plug from a surface thereof. This semiconductor device manufacture method can prevent breakdown of a plug when a capacitor is formed on the plug.

9 Claims, 13 Drawing Sheets

SEMICONDUCTOR DEVICE HAVING A CAPACITOR WITH RARE METAL ELECTRODE

This application is based on Japanese Patent Application 2000-255708, filed on Aug. 25, 2000, the entire contents of which are incorporated herein by reference.

BACKGROUND OF THE INVENTION a) Field of the Invention

The present invention relates to a semiconductor device and its manufacture method, and more particularly to a semiconductor device having capacitors and its manufacture method.

b) Description of the Related Art

Still higher integration of semiconductor integrated circuits is required nowadays. Semiconductor memory devices with capacitors are required to form each capacitor having a three-dimensional structure, along with the miniaturization of the memory cell.

A capacitor is considered as a combination of a lower electrode, a dielectric film and an upper electrode. A capacitor of a three-dimensional structure has the lower electrode of a three-dimensional structure on the surface of which the dielectric film and upper electrode are formed. In order to reduce the capacitor electrode area and have a sufficient capacitance, it is desired that the capacitor dielectric film is made of material having a high dielectric constant, such as tantalum oxide (having a stoichiometric composition of $Ta_2O_5$, hereinafter simply written as TaO). A high dielectric constant is intended to mean a specific dielectric constant of 20 or higher.

If a capacitor dielectric film is made of ferroelectric material, a non-volatile memory can be formed which retains its memory state even if the power is turned off. Ferroelectric material may be strontium titanate ($SrTiO_3$, hereinafter simply written as STO), barium strontium titanate ($Ba_xSr_{1-x}TiO_3$, hereinafter simply written as BST), lead zirconium titanate ($Pb_{1-x}Zr_xTiO_3$, hereinafter simply written as PZT) or the like.

These dielectric materials are oxide. It is desired to perform a heat treatment (annealing) in an oxygen-containing oxidizing atmosphere after a dielectric film is formed. Therefore, the lower electrode is desired to be made of metal having a high resistance against oxidation, metal retaining conductivity even after it is oxidized, or oxide of this metal. Rare metal such as Ru, Ir and Pt has been studied as such metal of the lower electrode. The concept of rare metal is inclusive of noble metal.

There are some problems in using rare metal as the material of electrodes and wiring lines. If rare metal is in direct contact with silicon, silicide is formed when heated. The resistivity of silicide is higher than that of metal, and the silicidation process does not occur uniformly along the depth direction (making a more irregular surface). In order not to form silicide, it is desired to insert a barrier metal layer between rare metal and silicon. As barrier metal, nitride of a single metal such as TiN and WN (representing $WN_x$), nitride of two or more metals such as TiAlN have been studied.

Rare metal has the property of allowing passage of oxygen, hydrogen and the like. If there is a metal layer made of general wiring material such as Al, Cu and W under a rare metal layer and the underlying metal layer is oxidized by oxygen penetrated through the rare metal layer, the metal layer raises its resistivity, becomes an insulating layer, expands its volume, and so on.

A W plug is used as a conductive plug passing through an inter-level insulating film. On this W plug, a Ru layer is deposited to some thickness, for example, by sputtering, and thereafter Ru is deposited by chemical vapor deposition (CVD) by using oxygen catalyst. In this case, if the W plug is oxidized, the W plug and upper structure may be broken by volume expansion of the plug.

A capacitor is constituted of a pair of electrodes and a dielectric film between the electrodes. If the electrodes are flat, the electric field between the electrodes is generally uniform. However, if the electrode has a three-dimensional structure, the electric field generated in the dielectric film is not necessarily uniform.

A cylinder type capacitor has a lower electrode of a cap shape. The top surface of the lower electrode is defined by chemical mechanical polishing (CMP) or the like, and is generally perpendicular to its side walls. An electric field concentrates upon the boundary between the top surface and side wall of the lower electrode. If the dielectric film has a uniform thickness, the dielectric film at the boundary between the top surface and side wall becomes more likely to be dielectrically broken. If the dielectric film is made thick in order to avoid such dielectric breakdown, the dielectric film becomes unnecessarily thick on the flat surface area.

As a Ru layer is patterned by using a resist mask, etching by-products called a fence are deposited on the resist mask. The by-products once formed are difficult to be removed.

Generally, transistors are annealed in a hydrogen atmosphere in order to improve their characteristics. Ru is considered to generate hydrogen radicals through catalyst reaction during this annealing. The dielectric oxide film of a capacitor may be reduced by the hydrogen radicals, so that its characteristics may change.

In the above description, although Ru is mainly used as the electrode material, similar problems may occur even if other rare metals are used.

As described above, various problems to be solved occur as the structure is made smaller.

SUMMARY OF THE INVENTION

It is a first object of the present invention to provide a semiconductor device manufacturing method capable of preventing breakdown of a plug when a capacitor is formed on this plug.

It is a second object of the present invention to provide a semiconductor device manufacturing method capable of forming a small-size capacitor, while dielectric breakdown is efficiently prevented.

It is a third object of the present invention to provide a method of manufacturing a semiconductor device with a capacitor structure capable of suppressing the element deterioration during patterning and annealing in a hydrogen atmosphere.

It is still another object of the present invention to provide a semiconductor device capable of alleviating the above-described problems.

When the lower electrode of a capacitor is formed on a plug, there is a danger that the plug is oxidized and broken.

As the lower electrode of a capacitor is made thin, the problem of dielectric breakdown of a dielectric film between the upper and lower electrodes becomes serious. When the thickness of the electrode becomes comparable with that of the dielectric film, a possibility of dielectric breakdown increases exponentially.

When an electrode made of rare metal of a capacitor is patterned, etching by-products are formed, and during annealing in a hydrogen atmosphere, there is a possibility that the capacitor characteristics are changed.

According to one aspect of the present invention, there is provided a method of manufacturing a semiconductor device, comprising the steps of: (a) forming a first inter-level insulating film on a semiconductor substrate formed with semiconductor elements; (b) forming a contact hole through the first inter-level insulating film; (c) forming a plug made of conductive material capable of being nitrided, the plug being embedded in the contact hole; and (d) heating the semiconductor substrate in a nitriding atmosphere to nitride the plug from a surface thereof.

According to another aspect of the present invention, there is provided a method of manufacturing a semiconductor device, comprising the steps of: (a) forming a lower electrode on a semiconductor substrate formed with semiconductor elements, the lower electrode having a top surface and side surfaces; (b) forming a dielectric film on a surface of the lower electrode, the dielectric film being relatively thick in a region near a boundary between the top surface and each of the side surfaces and relatively thin and generally uniform in a lower region of the side surfaces; and (c) forming an upper electrode on the dielectric film.

According to another aspect of the present invention, there is provided a method of manufacturing a semiconductor device, comprising the steps of: (a) forming a rare metal layer on a semiconductor substrate formed with semiconductor elements; (b) forming an insulating mask layer on the rare metal layer; (c) patterning the insulating mask layer by using a resist pattern; and (d) pattering the rare metal layer by using the patterned insulating mask layer.

According to another aspect of the present invention, there is provided a semiconductor device comprising: a semiconductor substrate formed with semiconductor elements; an inter-level insulating film formed on the semiconductor substrate; and a WN plug passing through the inter-level insulating film, a nitrogen concentration of the WN plug lowering from a surface of the WN plug toward a deeper position.

As the surface of a W plug is nitrided, it is possible to prevent the W plug from being expanded in volume and the device performance from being deteriorated, which might be caused by invasion of oxygen.

By partially thickening the dielectric film of a capacitor, dielectric breakdown by electric field concentration can be prevented efficiently.

By using TaO as a mask, it is possible to avoid adverse effects of rare metal patterning and prevent $H_2$ from entering rare metal.

BRIEF DESCRIPTION OF THE DRAWINGS

FIGS. 1A to 1K are cross sectional views of a semiconductor substrate illustrating the main processes of a semiconductor device manufacturing method according to an embodiment of the invention.

DETAILED DESCRIPTION OF THE PREFERRED EMBODIMENTS

An embodiment of the invention will be described with reference to the accompanying drawings. This embodiment can solve a plurality of issues at the same time. Solution of each issue is not necessarily required to be combined with the solutions of other issues, but each solution constitutes an independent technical feature. There exists, therefore, a number of combinations of each technique of the embodiment and the conventional technique.

Figure 1A:
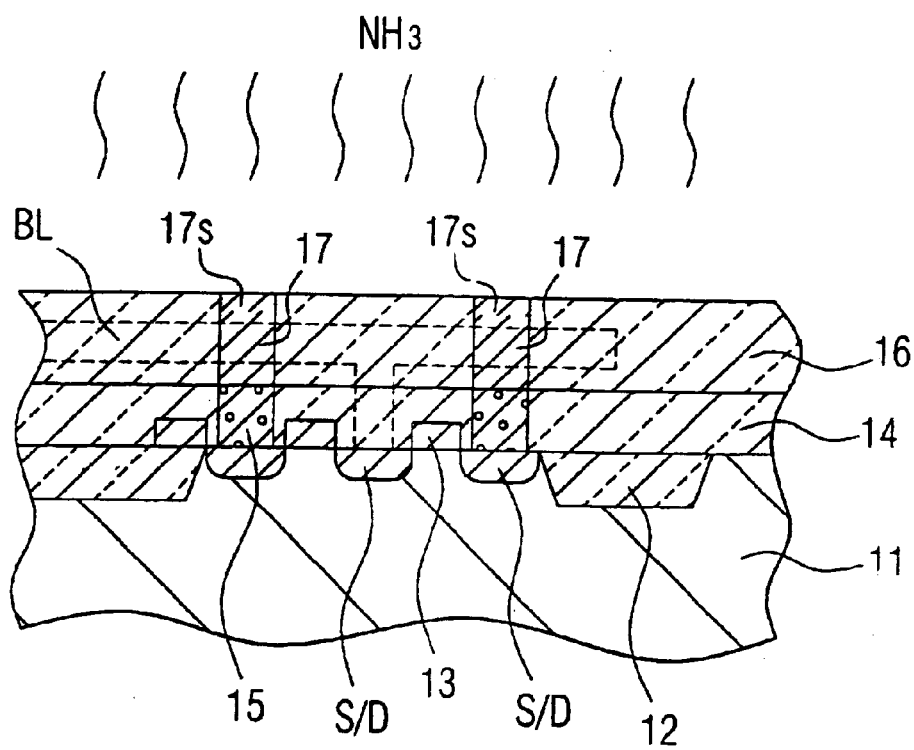

As shown in FIG. 1A, an isolation region 12 of $SiO_2$ is formed by shallow trench isolation (STI) on the surface of an Si substrate 11 having a p-type surface region. On the surface of an active region defined by the isolation region 12, an insulated gate electrode 13 is formed.

Figure 1B:
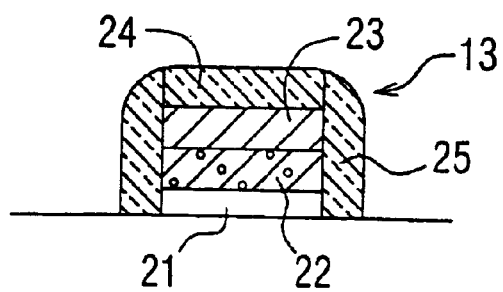

As shown in FIG. 1B, the insulating gate electrode 13 has: a gate insulating film 21 of $SiO_2$ formed on the Si surface; a lower gate electrode 22 of polysilicon formed on the gate insulating film 21: an upper gate electrode 23 of tungsten silicide (hereinafter simply written as WSi) or the like formed on the lower gate electrode 22; an etch stopper layer 24 of SiN or the like formed on the upper gate electrode 23; and side wall etch stoppers 25 of silicon nitride ($SiN_x$, hereinafter simply written as SiN) or the like covering the gate electrode side walls. The side wall etch stopper 25 covers at least a portion of the side wall of the etch stopper layer 24. For simplicity purposes of the drawings, the insulated gate is shown in the following drawings in the simplified form 13 shown in FIG. 1A.

After the insulated gate electrode 13 is formed, a first inter-level insulating film 14 of $SiO_2$ or the like is formed. Contact holes are formed through the first-level insulating film 14 at predetermined positions, and plugs 15 of polysilicon are embedded in these contact holes. The plug is formed by chemical vapor deposition (CVD) and chemical mechanical polishing (CMP) for the removal of unnecessary polysilicon.

Thereafter, a second inter-level insulating film 16 of $SiO_2$, BPSG or the like is formed over the whole substrate surface. The second inter-level insulating film 16 is first deposited to an intermediate level, and after a bit line BL is formed, it is deposited to a predetermined thickness while burying the bit line BL. A contact hole reaching the plug 15 is formed through the second inter-level insulating film 16. W is blanket-grown filling the inside of the contact hole, and the W layer on the flat surface of the second inter-level insulating film 16 is removed by CMP. In this manner, the W plug 17 is formed.

A silicon nitride (SiN) layer is formed on the second inter-level insulating film 16. If this SiN layer is to be formed by CVD, mixture gas of: polychloro-silane such as dichloro-silane or polysilane; and ammonia, is used as source gas.

Before the SiN layer is grown, only ammonia gas is flowed and the substrate is heated to a temperature range 600° C. to 850° C. On the surface of the W plug 17, ammonia $NH_3$ and W react to change tungsten W to tungsten nitride (simply written as WN).

Figure 2:
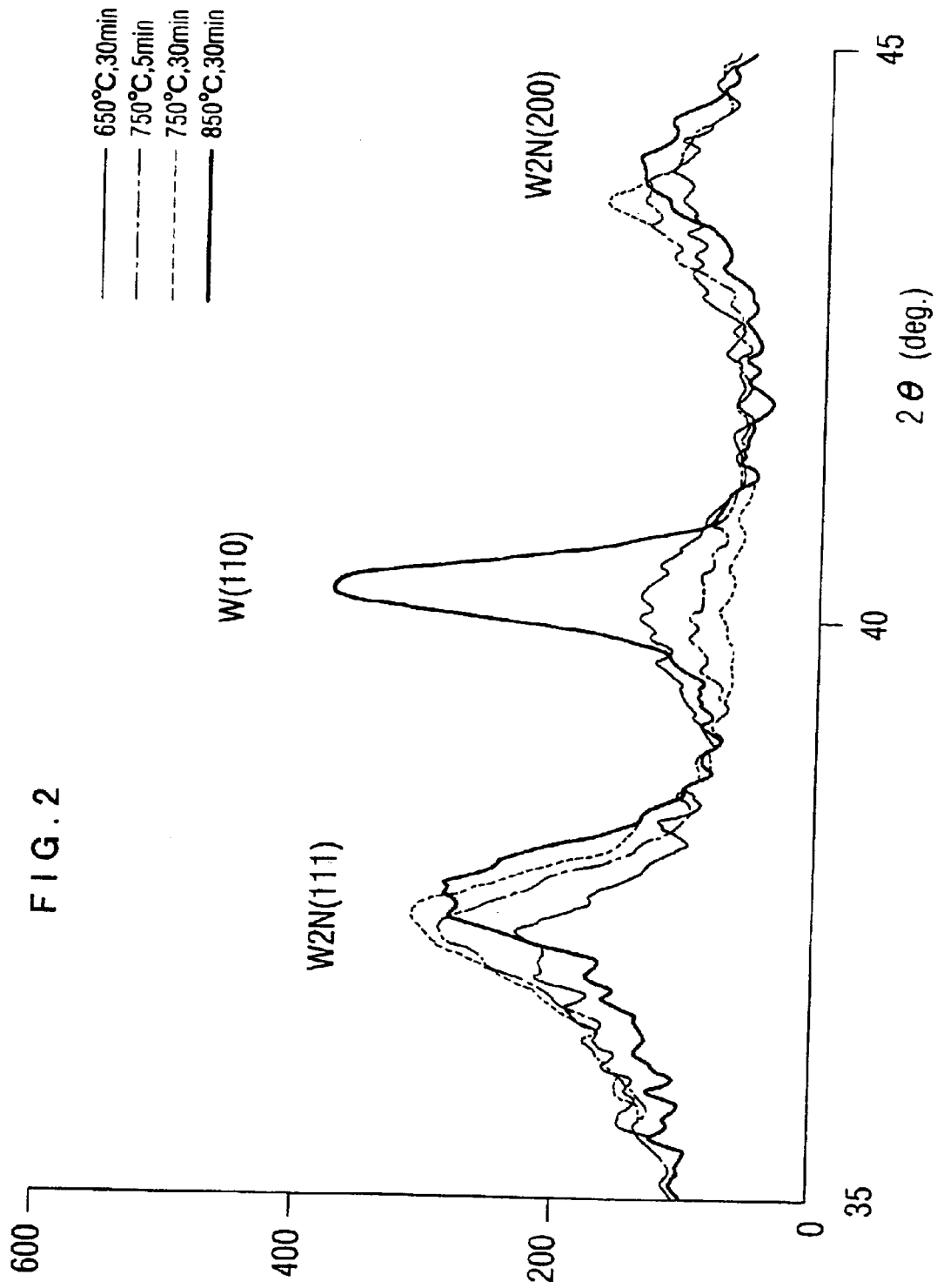
FIG. 2 is a graph explaining nitridation of a W surface.

FIG. 2 is a graph showing X-ray diffraction of W heated in an ammonia atmosphere. Only a peak of W (110) is observed in the case of pure W. When W changes to $W_2N$, peaks $W_2N$ (111) and $W_2N$ (200) are observed.

At a temperature lower than 600° C., nitridation reaction hardly progresses. At a temperature higher than 850° C., nitridation and denitridation reactions compete against each other so that an effective nitridation reaction progresses slowly. As seen from the graph, progress of the nitridation reaction is greatest near at 750° C. and WN can be formed efficiently.

Such heat treatment of the W plug 17 in the nitriding atmosphere forms a nitrided region 17s on the surface of the W plug. As compared to W, WN has the property of being hardly oxidized. It can be considered that the concentration of N in the nitrided region 17s gradually lowers from the surface toward the deeper position.

Instead of nitridation of the W plug, W may be deposited by CVD to an intermediate level and thereafter WN is deposited by CVD to form a laminated plug of WN/W. This two CVD processes and the nitridation process may be combined. Instead of W, other conductive metal such as Ti and Ta, which maintain conductivity even when nitrided, may be used.

Figure 1C:
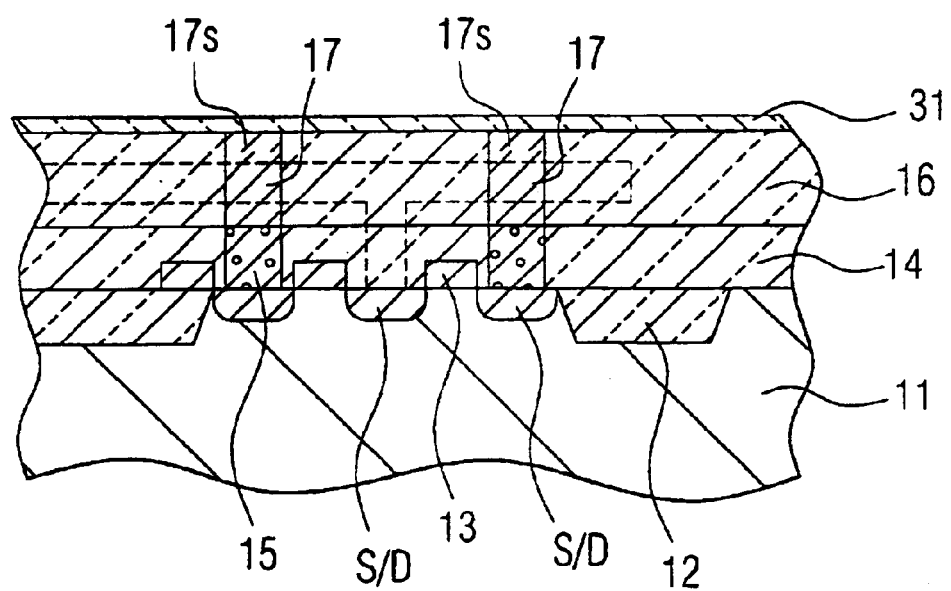

As shown in FIG. 1C, the substrate is heated to an SiN film forming temperature and mixture gas of ammonia and dichloro-silane is supplied, to form an SiN layer 31 on the second inter-level insulating film 16. This SiN layer 31 functions as an etch stopper when an oxide film to be formed on the SiN layer 31 is etched.

Figure 1D:
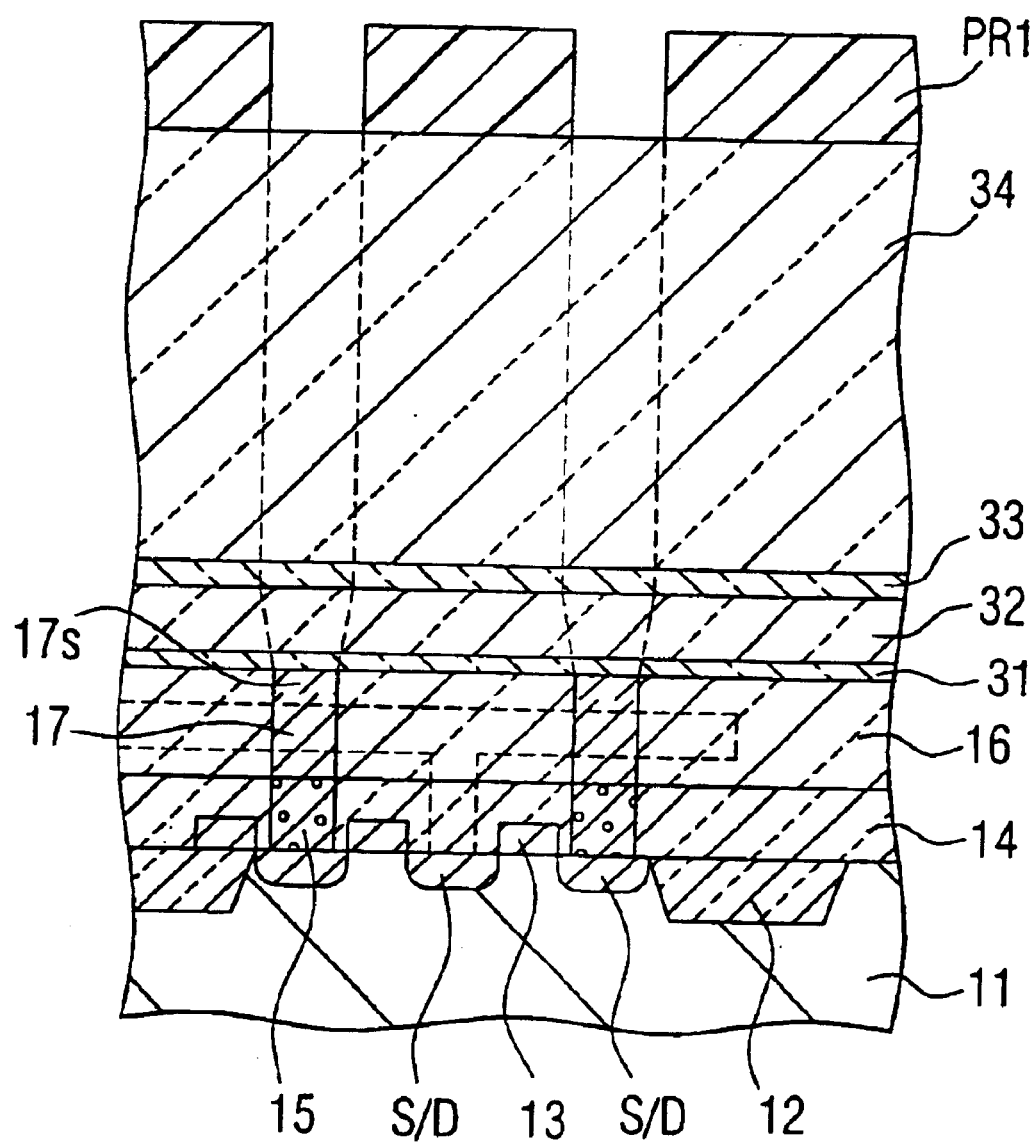

As shown in FIG. 1D, after the SiN layer 31 is formed, an $SiO_2$ layer 32 and an SiN layer 33 are formed. The SiN layer 33 functions as an etch stopper when a sacrificial film such as an oxide film to be formed on the SiN layer 33 is etched. The SiN layers 31 and 33 both have a thickness of, for example, 40 nm and the $SiO_2$ layer 32 has a thickness of 100 nm. These layers 31, 32 and 33 constitute a pedestal or foundation for increasing a force of supporting the lower electrode of a capacitor to be formed later.

The etch stopper layer used during oxide film etching has preferably an etch selection ratio of 10 or higher relative to the etch rate of the oxide film. TaO, NbO or the like may be used in place of SiN. If Tao, NbO or the like is used, the film thickness is preferably set to 10 nm or thicker. TiO, alumina or the like may also be used.

On the upper SiN layer 33, a thick silicon oxide film 34 is formed. This oxide film 34 functions as a mold of the lower electrode of each capacitor, together with the foundation constituted of the insulating layers 31, 32 and 33, and is a sacrificial film to be later removed. This silicon oxide film has a thickness of, for example, about 800 nm corresponding to the height of capacitors.

A resist layer is coated on the silicon oxide layer 34, exposed and developed to form a resist pattern PR1. The resist pattern PR1 has openings in the regions corresponding to capacitors. The diameter of the opening is, for example, about 130 nm.

By using the resist pattern PR1 as an etching mask, the silicon oxide layer 34 is anisotropically etched by reactive ion etching (RIE). This etching stops at the surface of the upper SiN layer 33. The SiN layer 33 is etched by changing the etching conditions and thereafter the lower-level $SiO_2$ layer 32 is etched. This etching of the $SiO_2$ layer 32 stops at the surface of the lower SiN layer 31.

Even if the $SiO_2$ layer 32 is etched completely, the SiN layer 31 having a sufficient thickness is left because the SiN layer 31 has an etch rate of about 1/10 that of the $SiO_2$ layer 32. Then, the etching conditions are again changed to etch the SiN layer 31 and expose the surface of the plug 17. The surface layer of the plug 17 is constituted of the nitrided region 17s. Although WN is hard to be oxidized much more than W, WN is nevertheless a material capable of being oxidized.

It is therefore preferable to remove the resist pattern PR1 after the silicon oxide layer 34 is etched and before the SiN layer 31 is etched. Oxidation of the plug can be prevented perfectly by covering the surface of the plug 17 with the SiN layer 31 during ashing.

Figure 1E:
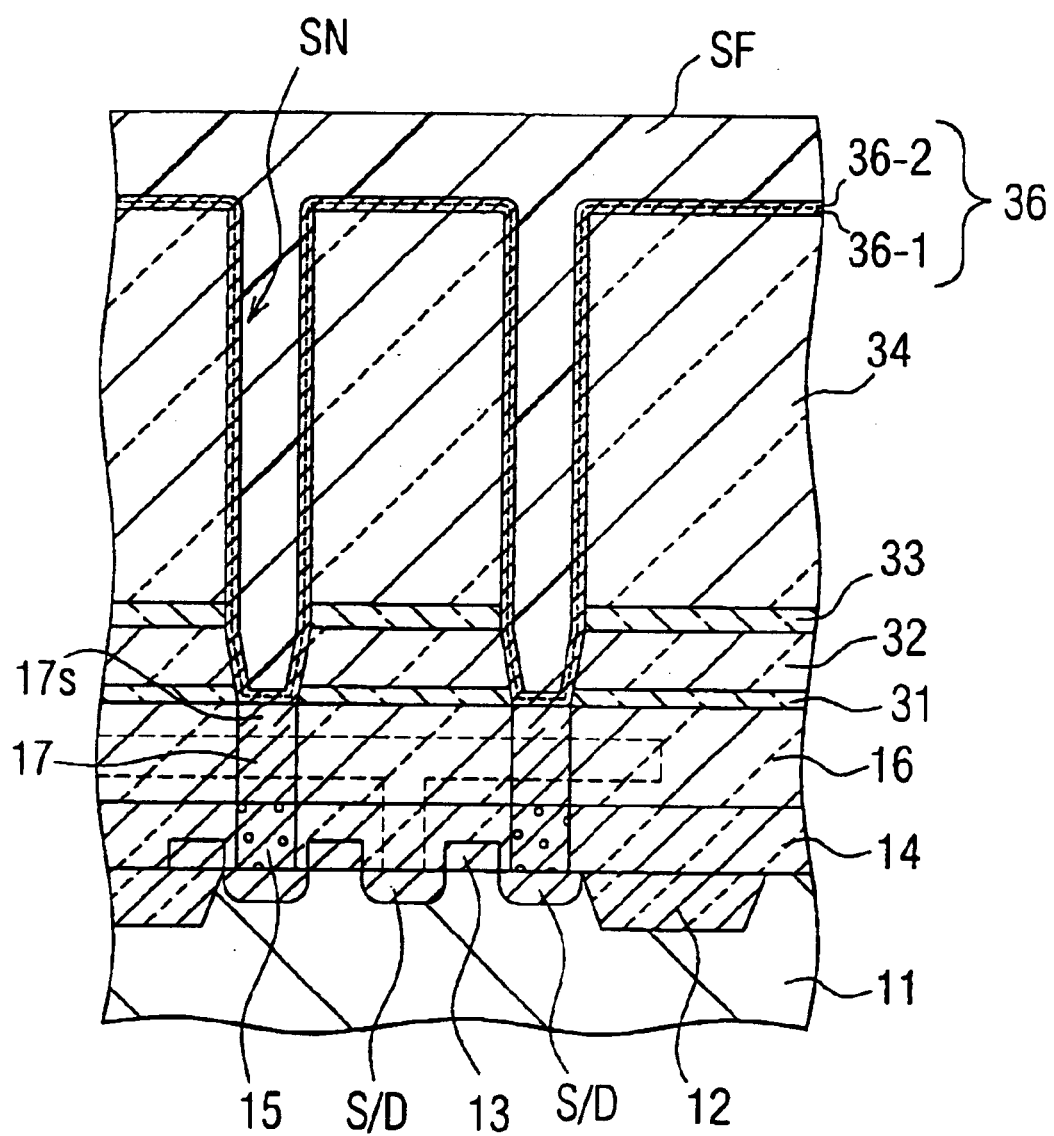

As shown in FIG. 1E, a lower electrode layer 36 is deposited on the inner surfaces of the capacitor openings SN. The lower electrode layer 36 is made of rare metal such as Ru and Pt and has a thickness of, for example, about 30 nm. CVD is suitable for forming an electrode having a uniform thickness on the inner surface of an opening having a high aspect ratio. However, CVD of rare metal generally uses oxygen as catalyst. Although the surface layer of the plug 17 is constituted of the nitrified region 17s, direct contact with oxygen is not preferable.

From this reason, a pure rare metal layer, e.g., an Ru layer 36-1 is first formed under the conditions that oxygen is not used, e.g., by sputtering or the like. Thereafter, the remaining rare metal layer, e.g., an Ru layer 36-2 is formed by CVD. For example, this CVD uses Ru(EtCp)$_2$ or Ru(Cp)$_2$ as source gas and catalyst gas which contains oxygen is added to promote decomposition of the source gas. Source gas may be supplied by dissolving it into solvent such as THF (tetrahydrofuran($C_4H_8O$)) or the like.

The amount of oxygen as catalyst can be reduced when CVD is performed for depositing Ru on the already formed Ru layer. Since the plug surface is covered with the Ru layer 36-1 and the amount of catalyst oxygen can be reduced, oxidation of the plug 17 can be prevented efficiently. In order to further prevent oxidation of the plug, in addition to forming the Ru layer 36-1 under the conditions that oxygen is not used, it is more preferable to flow the source gas Ru(EtCp)$_2$ or Ru(Cp)$_2$, to make the gas be sufficiently adsorbed on the surface of the Ru layer 36-1, and thereafter to flow oxygen catalyst.

The Ru layer 36 deposited on the surface of the silicon oxide layer 34 is removed. Filler SF is embedded in the opening SN in order to prevent process dusts from being left in the opening or prevent damages of the Ru layer in the opening during CMP for this removal. The filler SF may be resist, spin-on-glass (SOG) or the like.

After the opening is filled with the filler, CMP is performed to remove the filler SF and Ru layer 36 on the surface of the silicon oxide layer 34.

Figure 1F:
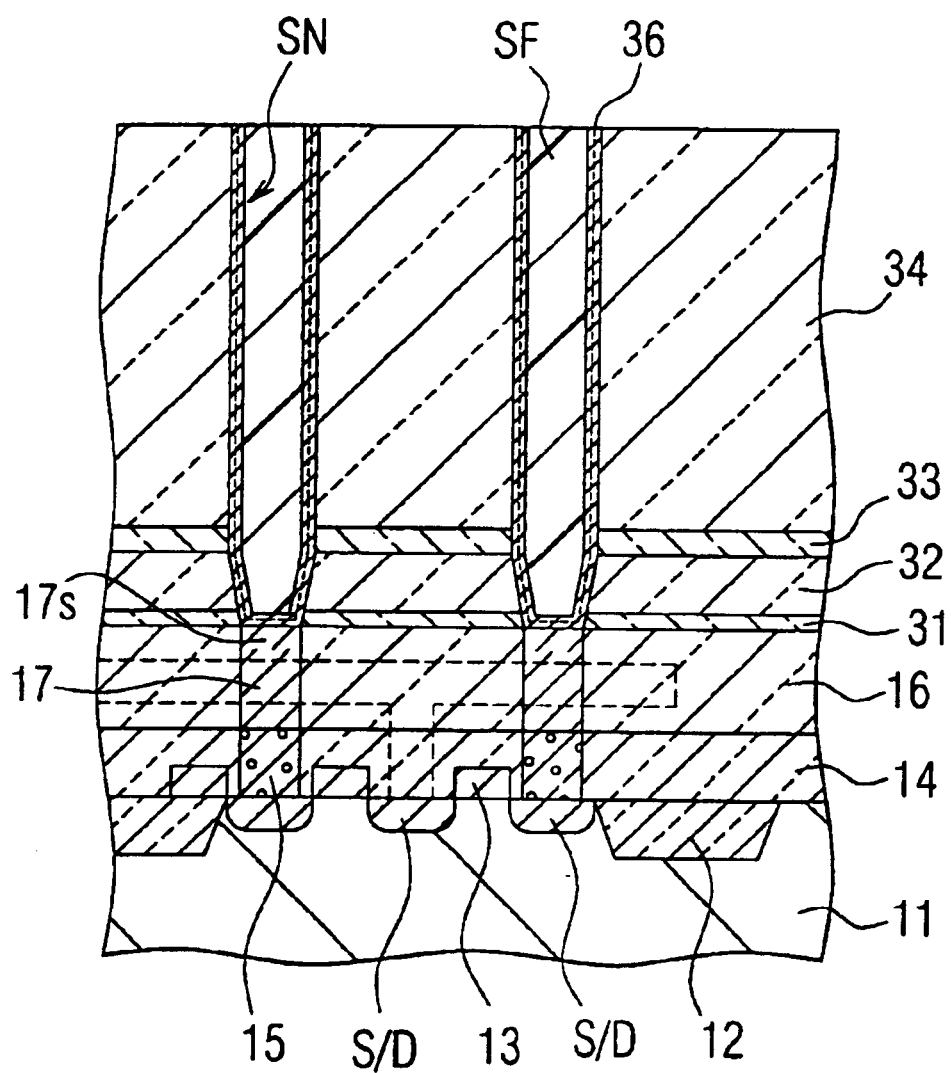

FIG. 1F shows the structure of the substrate after this CMP. The lower electrode 36 of Ru deposited on the inner wall of the opening SN has generally a uniform thickness. The top surface of the lower electrode 36 formed through CMP forms an approximately right angle to the side surface of the lower electrode.

Figure 1G:
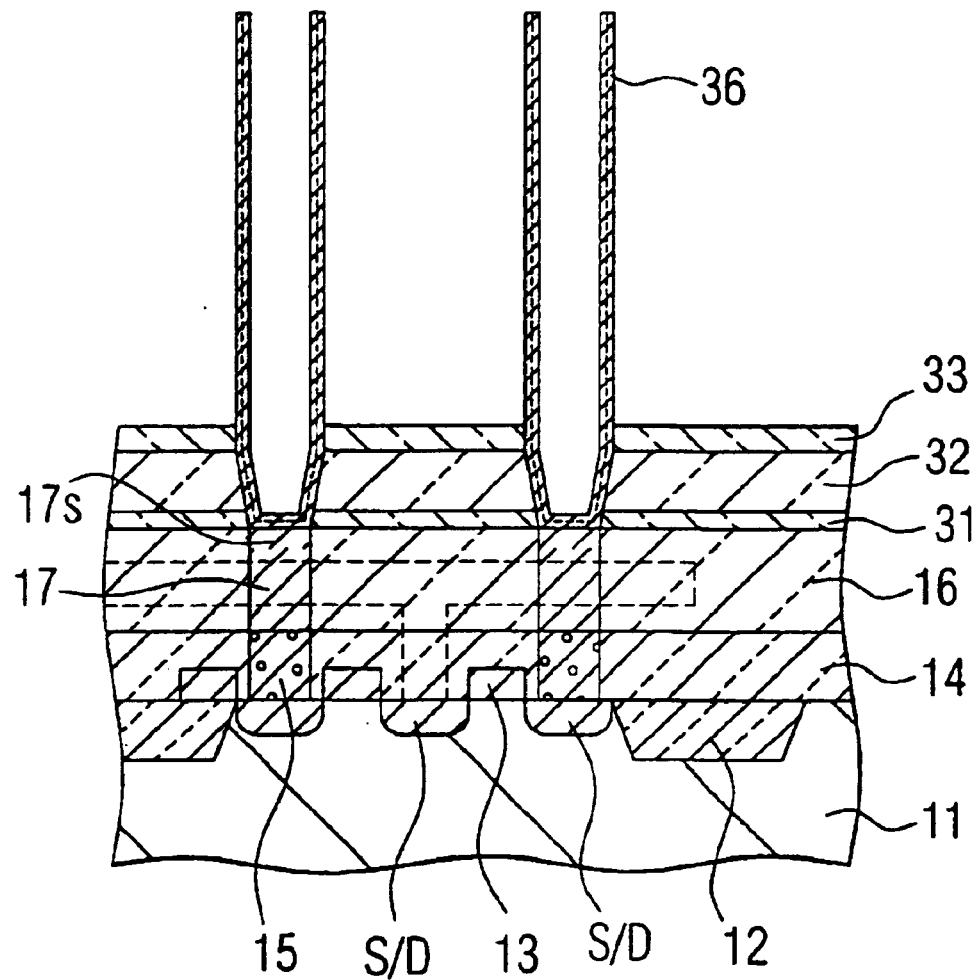

As shown in FIG. 1G, the silicon oxide layer 34 and the filler SF in the opening SN are removed. If the filler SF is made of SOG, the silicon oxide layer 34 and filler can be removed at the same time. If the filler SF is made of resist, after the silicon oxide layer 34 is removed, the resist in the opening SN is removed by resist remover or the like.

In removing the silicon oxide layer 34, wet etching using diluted hydrofluoric acid is performed which stops at the surface of the SiN layer 33. Since the SiN layer 31, $SiO_2$ layer 32 and SiN layer 33 are left, the lower portion of the lower electrode 36 are supported by the pedestal or foundation made of these three layers and fall or the like of the lower electrode can be prevented.

Figure 1H:
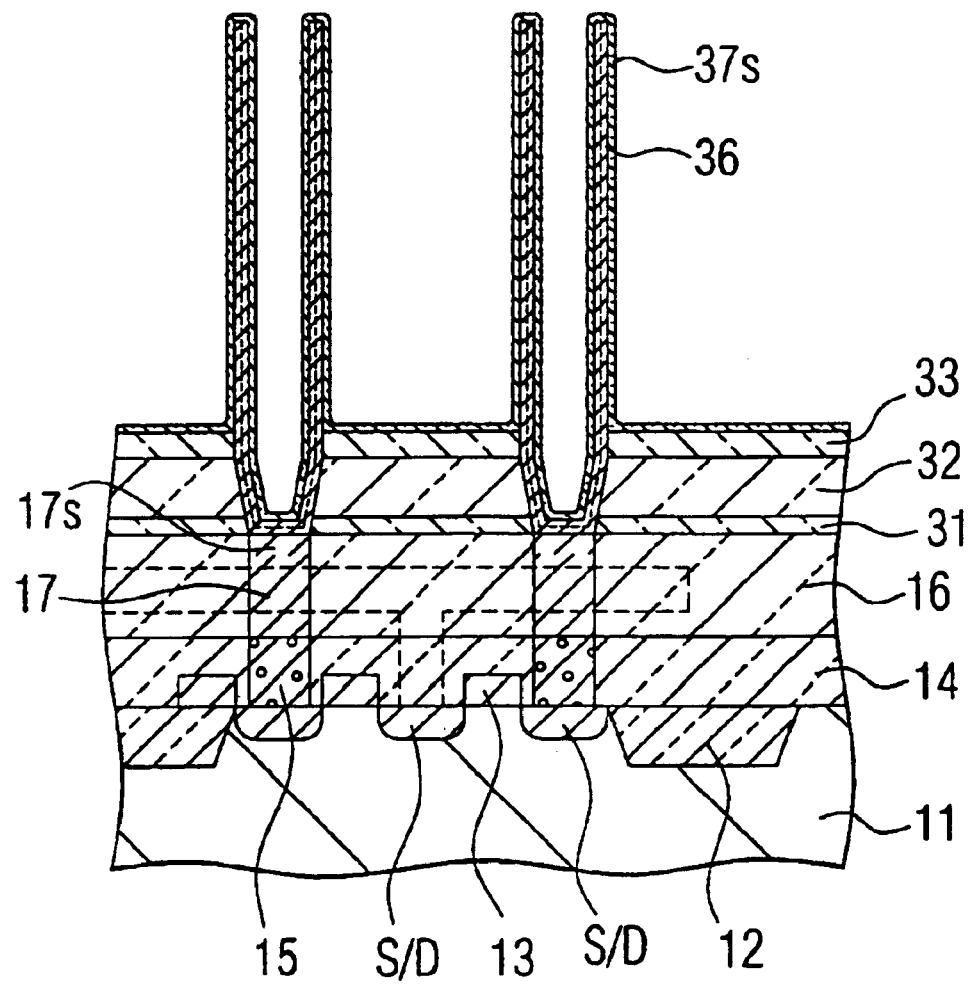
Figure 11:
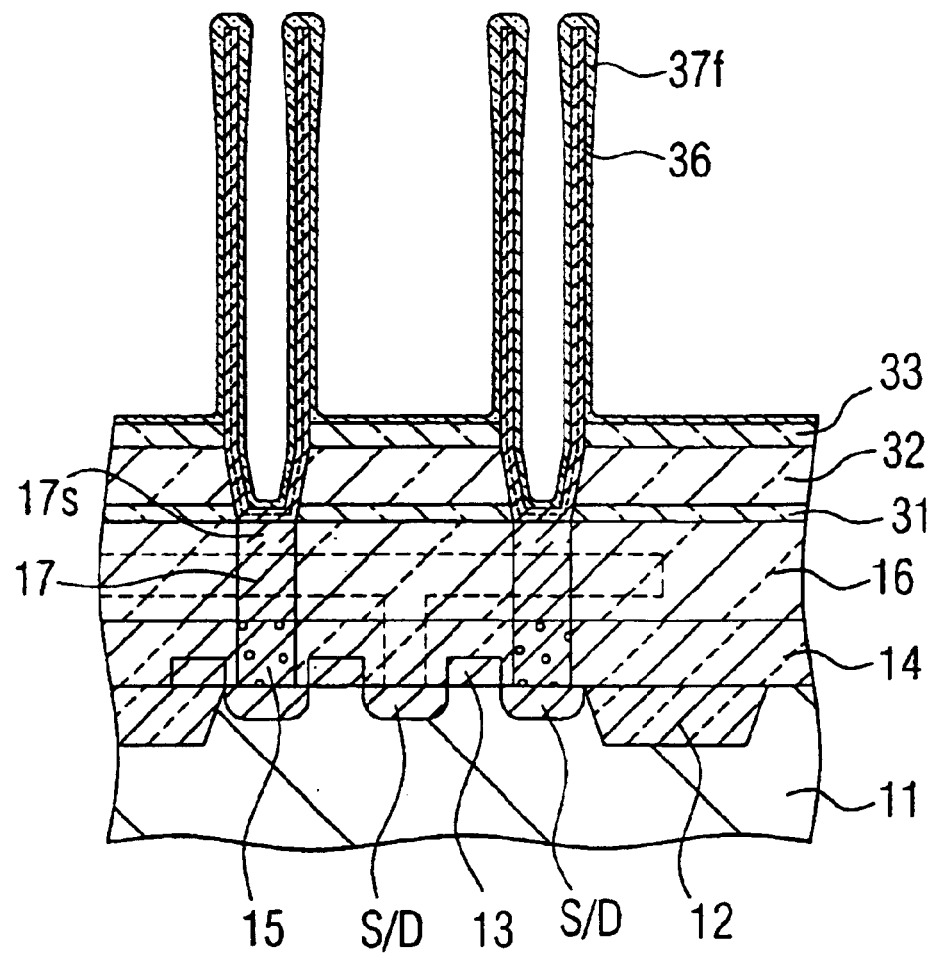

As shown in FIGS. 1H and 1I, a dielectric oxide film 37 (37s, 37f) of TaO or the like is formed on the surface of the lower electrode 36. The dielectric oxide film 37 is formed so that it becomes thick near the top surface of the lower electrode and has a generally uniform thickness at the lower side surface thereof. If the thickness of the dielectric film in the uniform thickness region is set to 8 nm to 20 nm, it is preferable that the thickness in the upper region is set thicker than that in the uniform thickness region by 5 nm to 20 nm.

Namely, by making the dielectric film thicker by about 60% or more in the top surface region, electric field concentration upon the corner of the lower electrode where the top surface and side surfaces meet each other, can be relaxed efficiently.

For example, as shown in FIG. 1H, the substrate is heated to a surface reaction limited, or reaction-determined rate CVD temperature and a lower dielectric film 37s having a uniform thickness is formed by low-pressure chemical vapor deposition (LP-CVD) using $Ta(O(C_2H_5))_5$ and $O_2$. The surface reaction limited temperature range is, for example, lower than 550° C. Since the dielectric film having a uniform thickness shown in FIG. 1H is first formed, the support force for the cylinder structure of the lower electrode can be enhanced.

As shown in FIG. 1I, after the dielectric film 37s having a uniform thickness is formed, the remaining dielectric film is formed under the conditions that the final dielectric film becomes thicker in the upper region of the lower electrode 36 of the cylinder shape.

The dielectric film thicker in the upper region may be formed by physical vapor deposition (PVD) such as sputtering and evaporation, low pressure chemical vapor deposition (LP-CVD) in a diffusion limited, or supply-determined rate temperature range, chemical vapor deposition in a diffusion limited, or supply-determined rate flow amount, low pressure chemical vapor deposition at a relatively high pressure, or the like.

The diffusion limited temperature range is 500° C. or higher in the case of CVD using $Ta(O(C_2H_5))_5$ and $O_2$. The diffusion limited flow amount is, for example, 16 mg/min or smaller, and the range of the relatively high pressure is 1.0 Torr or higher. With these processes, the dielectric film 37f can be formed which is thicker in the upper region of the lower electrode 36 of the cylinder shape and generally uniform and thin in the lower region.

Either the dielectric film having a uniform thickness or the dielectric film having an upper thicker region may be formed first.

Figure 3A:
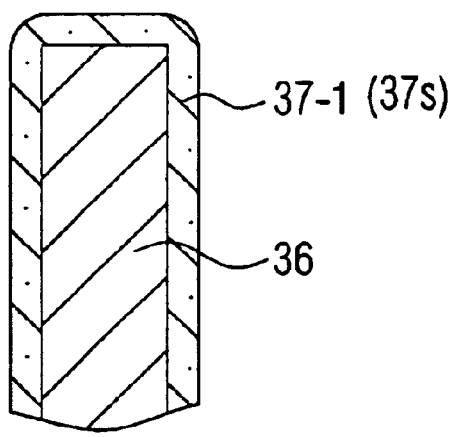
FIGS. 3A to 3D are cross sectional views illustrating a method of forming a dielectric film on an electrode of a three-dimensional structure, the dielectric film having a thicker upper portion and a thinner lower portion.
Figure 3B:
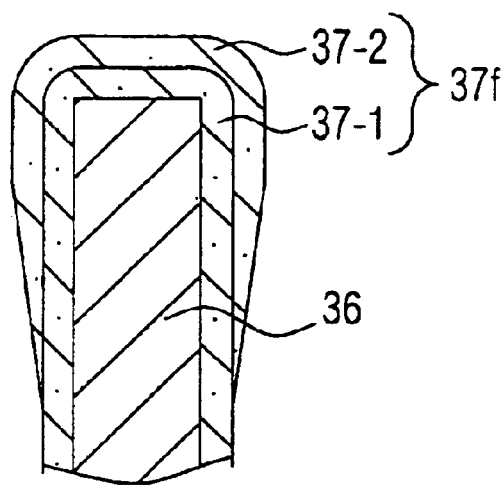

FIGS. 3A and 3B are schematic cross sectional views illustrating a process of forming the dielectric film 37f thicker in the upper region and thinner and generally uniform in the lower region, by first forming a dielectric film 37-1 having a uniform thickness and then forming a dielectric film 37-2 thicker in the upper region, as described previously.

Figure 3C:
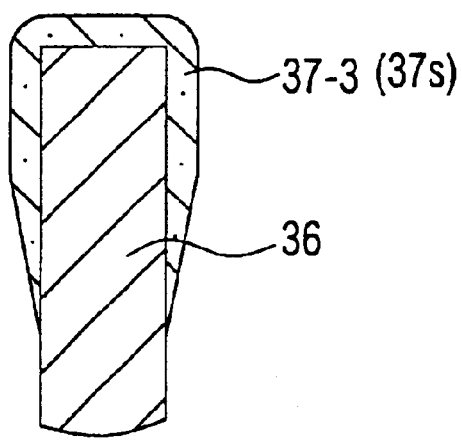

FIG. 3C is a schematic cross sectional view illustrating a process of first forming a dielectric film 37-3 on the lower electrode 36, the dielectric film being thicker in the upper region and thinner in the lower region. For example, the dielectric film 37-3 is formed by sputtering or evaporation. Oxidation of the plug can be prevented efficiently by forming the dielectric film under the conditions that oxygen is not used.

Figure 3D:
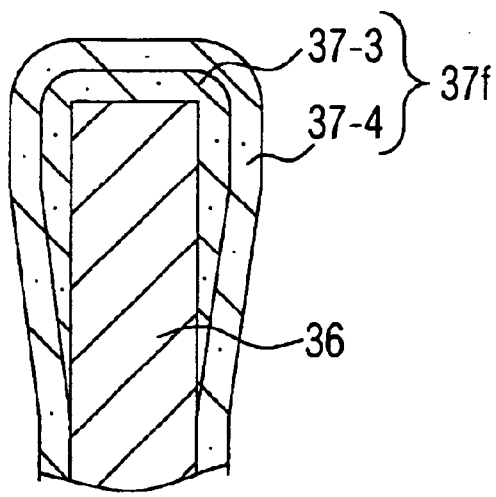

As shown in FIG. 3D, a dielectric film 37-4 having a uniform thickness is formed thereafter. Since the underlying dielectric film 37-3 is already formed, the amount of catalyst oxygen can be reduced when the dielectric film 37-4 having a uniform thickness is formed by CVD. By reducing the amount of oxygen during the process, oxidation of the upper surface of the plug can be prevented more efficiently.

Instead of the TaO film, the capacitor dielectric film may be a NbO film, a TiO film, a WO film, an alumina film, an STO film, a BST film, a PZT film, or a combination thereof.

Figure 1J:
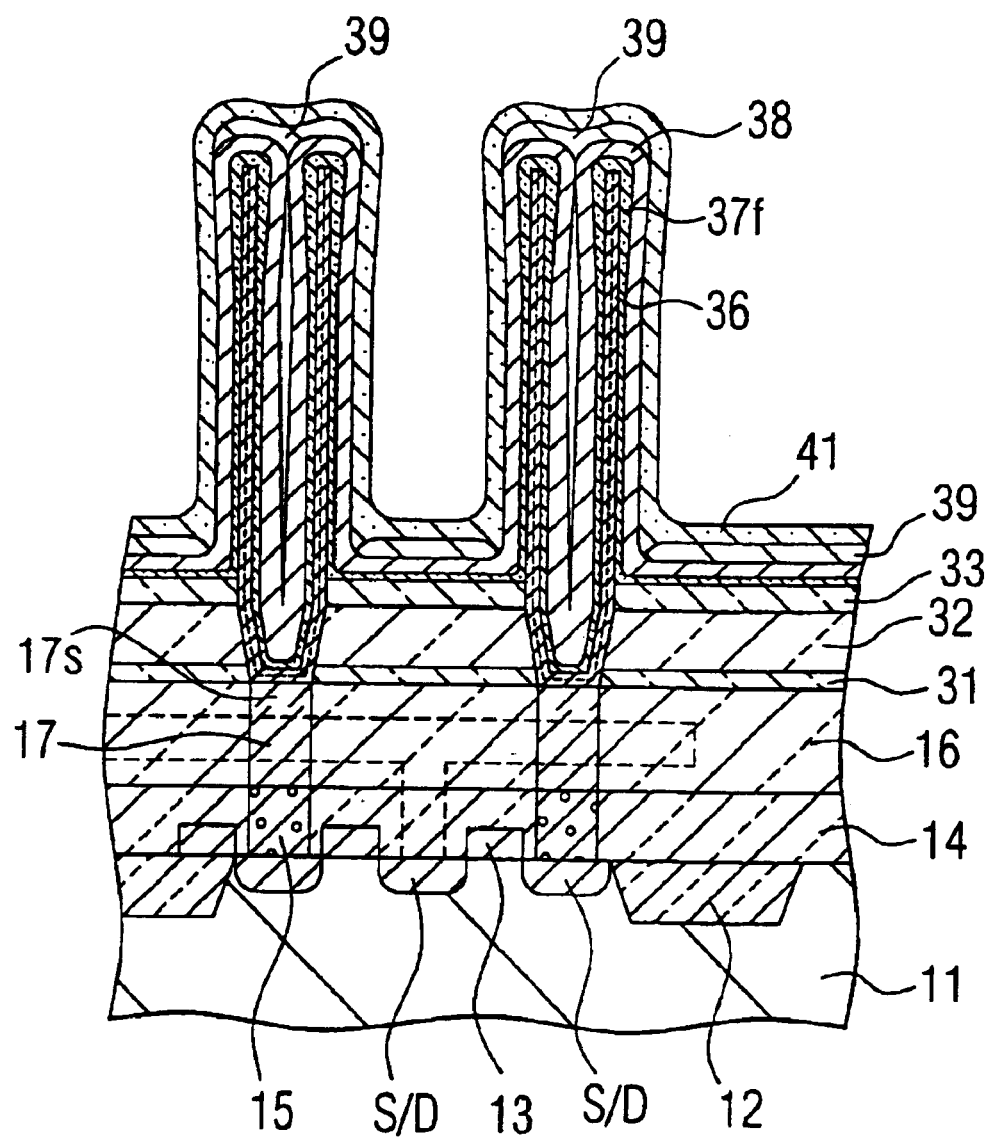

As shown in FIG. 1J, after the dielectric film 37f is formed, an Ru layer 38 to be used as the upper electrode is formed. The upper electrode of capacitors constitutes a plate electrode. The Ru layer 38 is formed, for example, by CVD using $Ru(EtCp)_2$ and $O_2$ as source gas.

Similar to the lower electrode, the upper electrode may be formed at two stages, without and with using oxygen. In this case, an oxygen containing layer is not formed near at the interface between the upper electrode and dielectric film. Therefore, oxygen in the dielectric film may be pulled into the upper electrode at a later heat treatment. This may deteriorate the performance of the dielectric film.

If an Ru layer is formed first by CVD, without forming a pure Ru layer by sputtering, a layer having a high oxygen concentration can be formed at the interface to the dielectric film. Further, $O_2$ gas may be flowed to allow O atoms be adsorbed on the surface layer of the dielectric film to a sufficient degree, and thereafter $Ru(EtCp)_2$ is flowed as source gas. In this manner, a film having a sufficient oxygen concentration can be formed at the interface to the dielectric film.

After the Ru upper electrode is formed, a TiN layer is deposited through physical deposition. By physical deposition from the higher position in the figure, a TiN layer 39 is formed. In this case, a metal nitride layer can be formed without using hydrogen-containing gas or hydrogen-containing atmosphere. Instead of physical deposition, chemical vapor deposition may be used. In this case, a TiN layer 39 of a uniform thickness can be formed.

Figure 1K:
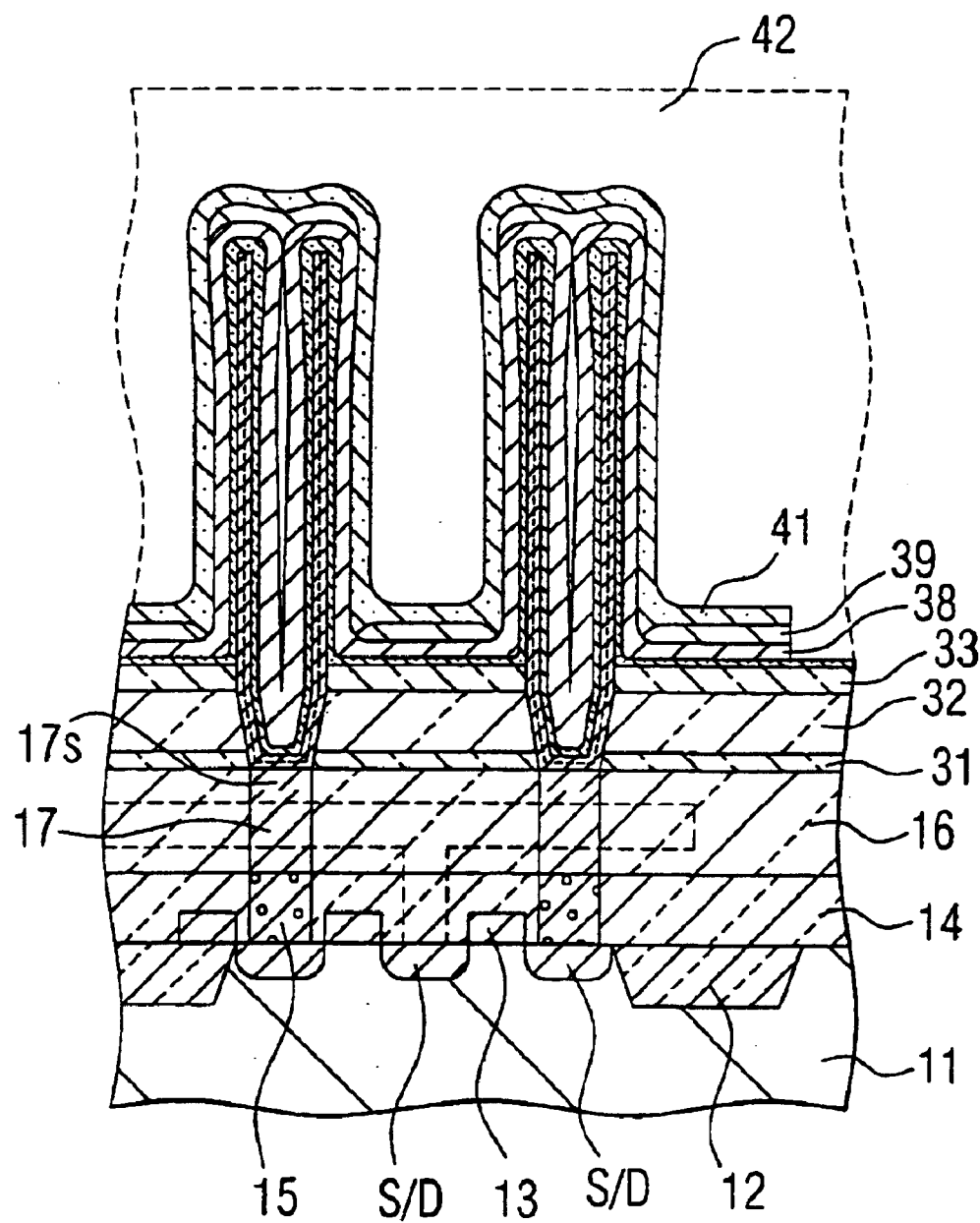

Next, a TaO layer 41 is formed by CVD similar to that described earlier. As shown in FIG. 1K, the TaO layer 41, TiN layer 39 and upper electrode layer 38 are patterned. In this pattering process, a resist pattern is formed on the TaO layer 41, and the TaO layer 41 is patterned by using the resist pattern as a mask. TaO can be chemically etched selectively, and it can provide a mask function during another etching process. The resist mask is removed at this stage.

Next, by using the TaO layer 41 as a mask, the underlying TiN layer 39 and upper electrode 38 are patterned. Since a resist mask is not used for etching the TiN layer 39 and Ru layer 38, the generation of by-products by the reaction between evaporated Ru and resist can be suppressed. Thereafter, an inter-level insulating film 42 of silicon oxide, BPSG or the like is formed to complete the semiconductor device. Here, it is preferable to use TEOS as silicon source, to reduce the amount of hydrogen generated in CVD process.

The TiN layer 39 is not an essential constituent element. The TaO layer 41 may be formed directly on the Ru layer 38. Also in this case, after the TaO layer is etched, the resist mask is removed so that etching by-products can be reduced. If the TiN layer is used, it can provide a function of a protective film covering the Ru layer 38 as well as a function of an adhesive layer between the Ru layer and upper-level insulating layer. The adhesive layer function may be provided not only by the TiN layer but also by a TaN layer, an NbN layer, a WN layer or the like.

By leaving the TaO film, the capacitor can be prevented from being deteriorated by a later $H_2$ annealing process.

In the above embodiment, a cylinder type capacitor is formed, and a TaO layer is formed on the surface of the capacitor and is then etched. This structure is not limited only to a cylinder type capacitor but can be applied to general use.

Figure 4A:
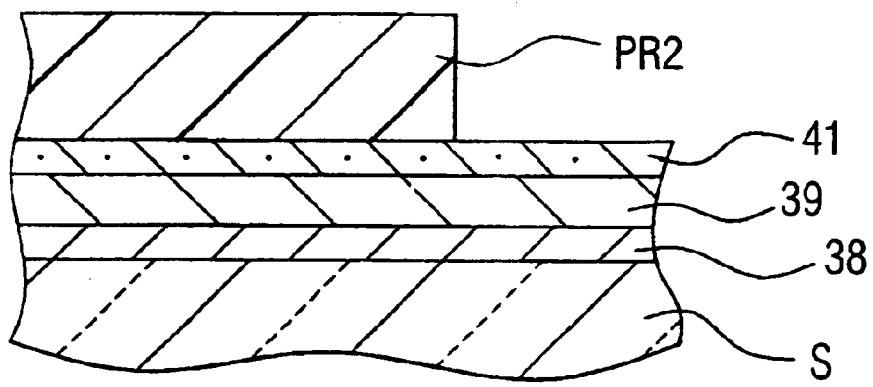
FIGS. 4A, 4B and 4C are cross sectional views of a semiconductor substrate illustrating a semiconductor device manufacturing method including a process of patterning a rare metal layer by forming a TaO film on the rare metal layer.

FIG. 4A is a cross sectional view illustrating a manufacture method utilizing a TaO layer in a patterning process. On an underlie substrate S, a rare metal layer 38 of Ru or the like is formed. On this rare metal layer 38, an intermediate layer 39 of TiN or the like and a TaO layer 41 are stacked. On the TaO layer 41, a resist pattern PR2 is formed.

Figure 4B:
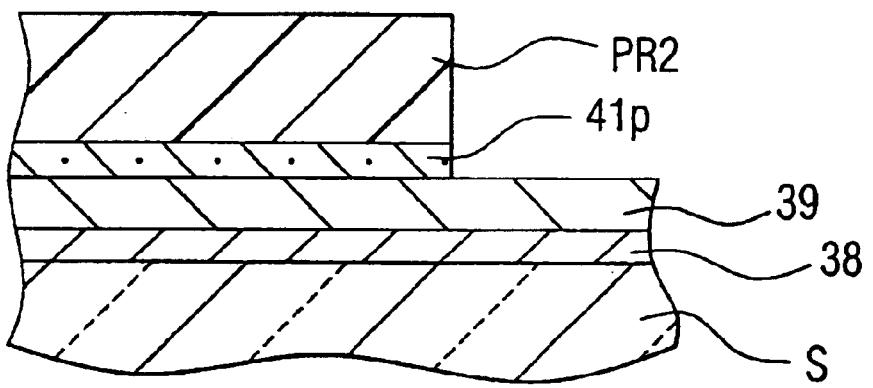

As shown in FIG. 4B, by using the resist pattern PR2 as a mask, the TaO layer is etched to form a patterned TaO layer 41*p*. The resist pattern PR2 is thereafter removed.

Figure 4C:
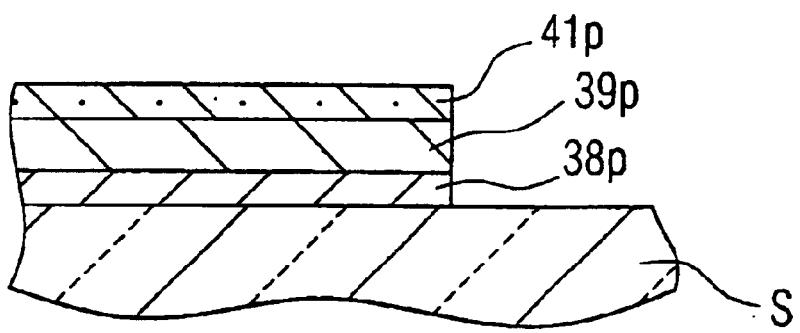

As shown in FIG. 4C, by using the TaO layer 41*p* as a mask, the underlying intermediate layer and rare metal layer are etched to form a patterned intermediate layer 39*p* and rare metal layer 38*p*. During this etching process, etching by-products may be generated from the rare metal layer 38. However, since resist does not exist, a possibility of generating by-products hard to be removed lowers. The TaO layer 41*p* may be left as part of the inter-level insulating film or it may be removed after the patterning process.

An $SiO_2$ layer may be deposited on the TaO layer to a thickness of, for example, about 300 nm, based on TEOS chemistry. Use of TEOS is advantageous in reducing the generation of hydrogen, compared to the use of silane. In this case, by using a resist mask, a lamination of the $SiO_2$ layer and TaO layer is etched. Next, after the resist mask is removed, the rare metal layer is etched. The $SiO_2$ layer is then removed by using HF solution. Etching residues arising from rare metal can therefore be removed.

Instead of TaO, the material of the mask layer may be alumina ($Al_2O_3$), NbO, $TiO(TiO_x)$, $SiO(SiO_x)$, or the like. The mask layer made of these materials may be removed after the patterning process or may be left as part of an inter-level insulating film.

The present invention has been described in connection with the preferred embodiments. The invention is not limited only to the above embodiments. It will be apparent to those skilled in the art that various modifications, improvements, combinations, and the like can be made.

I claim:

1. A method of manufacturing a semiconductor device, comprising the steps of:
    (a) forming a rare metal layer above a semiconductor substrate formed with semiconductor elements and a lower electrode and an oxide dielectric film of a capacitor;
    (b) forming a metal nitride layer in direct contact with the rare metal layer without using hydrogen-containing gas;
    (c) forming an insulating mask layer on the metal nitride layer;
    (d) patterning the insulating mask layer by using a resist pattern;
    (e) removing the resist pattern used in said step (d);
    (f) patterning the metal nitride layer by using the patterned insulating mask layer;
    (g) patterning the rare metal layer by using the patterned insulating mask layer and the patterned metal nitride layer, to constitute an upper electrode of the capacitor; and
    (h) forming an insulating film over the semiconductor substrate to cover the patterned insulating mask layer, the insulating film being a TEOS based SiO layer, wherein said step (d) is terminated before the rare metal layer is exposed.

2. A method of manufacturing a semiconductor device according to claim 1, wherein the insulating mask layer is made of at least one of TaO, alumina, NbO, TiO, and SiO.

3. A method of manufacturing a semiconductor device according to claim 1, further comprising the step of:
    (i) annealing the semiconductor substrate in hydrogen-containing gas.

4. A method of manufacturing a semiconductor device, comprising the steps of:
    (a) forming a rare metal layer above a semiconductor substrate formed with semiconductor elements and a lower electrode and an oxide dielectric film of a capacitor;
    (b) forming an insulating mask layer in direct contact with the rare metal layer;
    (c) patterning the insulating mask layer by using a resist pattern;
    (d) patterning the rare metal layer by using the patterned insulating mask layer to constitute an upper electrode of the capacitor; and
    (f) forming an insulating film over the semiconductor substrate, the insulating film covering the patterned insulating mask layer,
    wherein said insulating mask layer is a TaO layer and said insulating film is a TEOS based SiO layer.

5. A method of manufacturing a semiconductor device according to claim 4, wherein said resist pattern used in step (c) is removed before step (d).

6. A method of manufacturing a semiconductor device, comprising the steps of:
    (a) forming a rare metal layer above a semiconductor substrate formed with semiconductor elements;
    (b) forming a metal nitride layer on the rare metal layer without using hydrogen-containing gas;
    (c) forming an insulating mask layer on the metal nitride layer, the insulating mask layer being a stack of insulating layers;
    (d) patterning the insulating mask layer by using a resist pattern;
    (e) removing the resist pattern after said step (d);
    (f) patterning the metal nitride layer by using the patterned insulating mask layer;
    (g) patterning the rare metal layer by using the patterned insulating mask layer and the patterned metal nitride layer;
    (h) forming an insulating film over the semiconductor substrate, the insulating film covering the patterned insulating mask layer.

7. A method of manufacturing a semiconductor device according to claim 6, wherein said step (c) forms the insulating mask layer from two of TaO, alumina, NbO, TiO, and TEOS based SiO.

8. A method of manufacturing a semiconductor device according to claim 6, wherein said step (c) forms a stack of TaO, and TEOS based SiO.

9. A method of manufacturing a semiconductor device according to claim 6, wherein said step (c) forms a stack of a layer of alumina, NbO, or TiO, and layer of TEOS based SiO.

* * * * *